United States Patent
Chen et al.

(10) Patent No.: US 10,651,046 B2
(45) Date of Patent: May 12, 2020

(54) MULTIPLE PATTERNING WITH LATE LITHOGRAPHICALLY-DEFINED MANDREL CUTS

(71) Applicant: GLOBALFOUNDRIES Inc., Grand Cayman (KY)

(72) Inventors: Hsueh-Chung Chen, Cohoes, NY (US); Brendan O'Brien, Ballston Spa, NY (US); Martin O'Toole, Saratoga Springs, NY (US); Keith Donegan, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/154,237

(22) Filed: Oct. 8, 2018

(65) Prior Publication Data
US 2020/0111676 A1  Apr. 9, 2020

(51) Int. Cl.
  *H01L 21/311* (2006.01)
  *H01L 21/768* (2006.01)
  *H01L 21/033* (2006.01)

(52) U.S. Cl.
  CPC .... *H01L 21/31144* (2013.01); *H01L 21/0337* (2013.01); *H01L 21/0338* (2013.01); *H01L 21/76816* (2013.01); *H01L 21/76877* (2013.01)

(58) Field of Classification Search
  CPC ............... H01L 21/027; H01L 21/0271; H01L 21/0273; H01L 21/0274; H01L 21/0276;
  (Continued)

(56) References Cited

U.S. PATENT DOCUMENTS 8,455,364 B2  6/2013  Kanakasabapathy
8,741,763 B2  6/2014  Ma et al.
(Continued)

OTHER PUBLICATIONS

Ravi Prakash Srivastava et al., "Multiple Patterning With Lithographically-Defined Cuts" filed Oct. 8, 2018 as U.S. Appl. No. 16/154,306.
(Continued)

*Primary Examiner* — Zandra V Smith
*Assistant Examiner* — Molly K Reida
(74) *Attorney, Agent, or Firm* — Thompson Hine LLP; Anthony Canale (57) ABSTRACT

Methods of self-aligned multiple patterning. A mandrel is formed over a hardmask, and a planarizing layer is formed over the mandrel and the hardmask. The planarizing layer is patterned to form first and second trenches exposing respective first and second lengthwise sections of the mandrel. A portion of the patterned planarizing layer covers a third lengthwise section of the mandrel arranged between the first and second lengthwise sections of the mandrel. After patterning the planarizing layer, the first and second lengthwise sections of the mandrel are removed with an etching process to define a pattern including a mandrel line exposing respective first portions of the hardmask. The third lengthwise section of the mandrel is masked by the portion of the planarizing layer during the etching process, and the third lengthwise section covers a second portion of the hardmask arranged along the mandrel line between the first portions of the hardmask.

20 Claims, 8 Drawing Sheets

(58) Field of Classification Search
CPC ............... H01L 21/033; H01L 21/0332; H01L 21/0334; H01L 21/0335; H01L 21/0337; H01L 21/0338
See application file for complete search history.

(56) References Cited

U.S. PATENT DOCUMENTS

| | | | |
|---|---|---|---|
| 8,921,225 B2 | 12/2014 | Yuan et al. | |
| 9,818,641 B1 | 11/2017 | Bouche et al. | |
| 9,852,986 B1 * | 12/2017 | Stephens | ............... H01L 23/528 |

OTHER PUBLICATIONS

Martin O'Toole et al., "Multiple Patterning With Mandrel Cuts Defined by Block Masks", filed Oct. 8, 2018 as U.S. Appl. No. 16/154,284.

* cited by examiner

MULTIPLE PATTERNING WITH LATE LITHOGRAPHICALLY-DEFINED MANDREL CUTS

BACKGROUND

The present invention relates to semiconductor device fabrication and integrated circuits and, more specifically, to methods of self-aligned multiple patterning.

A back-end-of-line interconnect structure may be used to connect device structures, which were fabricated on a substrate during front-end-of-line processing, with each other and with the environment external to the chip. Self-aligned patterning processes used to form an interconnect structure involve linear mandrels acting as sacrificial features that establish a feature pitch. Non-mandrel lines are arranged as linear spaces between sidewall spacers that are formed adjacent to the sidewalls of the mandrels. After the mandrels are pulled to define mandrel lines, the sidewall spacers are used as an etch mask to etch a pattern predicated on the mandrel lines and the non-mandrel lines into an underlying hardmask. The pattern is subsequently transferred from the hardmask to an interlayer dielectric layer as trenches in which the interconnects are formed.

Mandrel cuts may be formed in the mandrels in order to section the mandrels and define discontinuities between the different sections. Non-mandrel cuts may also be formed along non-mandrel lines and may include portions of the spacer material used to form the sidewall spacers. The mandrel cuts and non-mandrel cuts are included in the pattern that is transferred to the hardmask and subsequently transferred from the hardmask to form the trenches in the interlayer dielectric layer. The mandrel cuts and non-mandrel cuts appear in the interconnect structure as adjacent interconnects that are spaced apart at their tips with a tip-to-tip spacing related to the dimension of the discontinuity.

The tip-to-tip spacing for the sections of a cut mandrel is limited to a distance equal to twice the thickness of the sidewall spacers. If the tip-to-tip spacing is greater than this distance, the sidewalls spacers do not merge between the tips of the sections of the mandrel, which results in incomplete filling of the mandrel cut. Transverse to the length of the cut mandrel, the mandrel cut is arranged in the pattern laterally between non-mandrel lines that flank the cut mandrel line. The result of the incomplete filling can be a conductive link shorting interconnects formed using the non-mandrel lines flanking the mandrel cut.

Even if the filling of the mandrel cut is complete, the wrapping of the sidewall spacers about the tips of the sections of the cut mandrel may introduce notches or indents at the side edges of the merged sidewall spacers. These notches or indents appear in the interconnect structure as kinks that project from the side edges of wires formed using the non-mandrel lines flanking the mandrel cut. The proximity of these kinks to each other may also result in shorting.

Improved methods of self-aligned multiple patterning are therefore needed.

SUMMARY

In an embodiment of the invention, a method includes depositing a hardmask over an interlayer dielectric layer, forming a mandrel over the hardmask, and forming a planarizing layer over the mandrel and the hardmask. The planarizing layer is patterned to form a first trench exposing a first lengthwise section of the mandrel and a second trench exposing a second lengthwise section of the mandrel. The patterned planarizing layer also includes a portion covering a third lengthwise section of the mandrel that is arranged between the first lengthwise section of the mandrel and the second lengthwise section of the mandrel. After patterning the planarizing layer, the first and second lengthwise sections of the mandrel are removed with an etching process to define a pattern including a mandrel line exposing respective first portions of the hardmask. The third lengthwise section of the mandrel is masked by the portion of the planarizing layer during the etching process and covers a second portion of the hardmask arranged along the mandrel line between the first portions of the hardmask.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

FIG. 1A is a top view of the structure at the fabrication stage of FIG. 1 in which FIG. 1 is taken generally along line 1-1.

FIG. 4A is a top view of the structure in which FIG. 4 is taken generally along line 4-4.

FIG. 5A is a top view of the structure in which FIG. 5 is taken generally along line 5-5.

FIG. 7A is a top view of the structure in which FIG. 7 is taken generally along line 7-7.

FIG. 10A is a top view of the structure in which FIG. 10 is taken generally along line 10-10.

DETAILED DESCRIPTION

Figure 1:
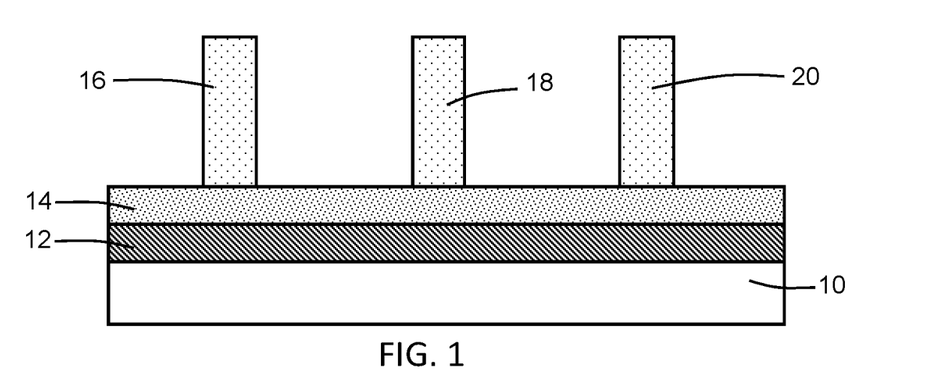
FIGS. 1-10 are cross-sectional views of a structure at successive fabrication stages of a processing method in accordance with embodiments of the invention.
Figure 1A:
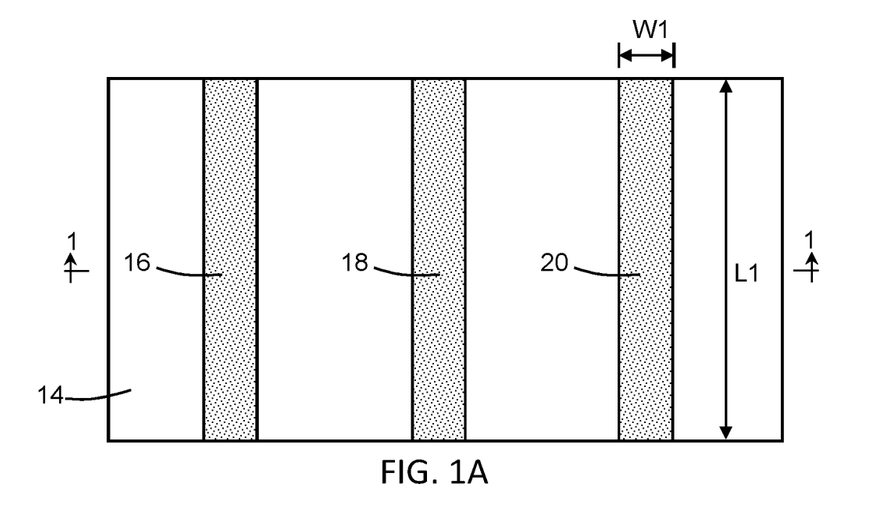

With reference to FIGS. 1, 1A and in accordance with embodiments of the invention, an interlayer dielectric layer 10 may be composed of one or more electrically-insulating dielectric materials, such as a low-k dielectric material formed using a siloxane such as octamethylcyclotetrasiloxane (OMCTS). The interlayer dielectric layer 10 may be located on a substrate that includes device structures fabricated by front-end-of-line (FEOL) processing to form an integrated circuit. A layer stack including a hardmask 12 and a hardmask 14 is arranged over the interlayer dielectric layer 10 with the hardmask 12 arranged in a vertical direction between the interlayer dielectric layer 10 and the hardmask 14. The layer stack may include an additional hardmask (not shown) composed of a dielectric material, such as silicon-oxygen nitride, between the hardmask 12 and the interlayer dielectric layer 10.

The hardmasks 12, 14 are used to perform pattern transfer to the interlayer dielectric layer 10 during a self-aligned multiple patterning process, such as self-aligned double patterning (SADP). The hardmasks 12, 14 are composed of different materials characterized by dissimilar etch selectivities. The hardmask 12 may be composed of, for example, titanium nitride (TiN) or titanium oxide ($TiO_x$) deposited by, for example, physical vapor deposition (PVD), atomic layer deposition (ALD), or chemical vapor deposition (CVD). The hardmask 14 is removable from the hardmask 12 selective to the material of the hardmask 12, and the hardmask 12 is removable from the interlayer dielectric layer 10 selective to the material of the interlayer dielectric layer 10. The hardmask 14 may be composed of a dielectric material, such as silicon nitride (SiN) or titanium oxide ($TiO_x$), deposited by, for example, atomic layer deposition or chemical vapor deposition. As used herein, the terms "selective" and "selectivity" in reference to a material removal process (e.g., etching) denotes that the material removal rate (i.e., etch rate) for the targeted material is higher than the material removal rate (i.e., etch rate) for at least another material exposed to the material removal process.

Mandrels 16, 18, 20 are formed from a layer of material that is deposited on a top surface of the hardmask 14. For example, lithography and etching processes may be used to pattern an etch mask with an etching process, which is used in turn to pattern the mandrels 16, 18, 20 with another etching process. The layer used to form the mandrels 16, 18, 20 may be composed of amorphous silicon (α-Si), amorphous carbon (α-C), or a spin-on hardmask (SOH). The etch mask used to pattern the mandrels 16, 18, 20 may be removed after patterning the mandrels 16, 18, 20. Each of the mandrels 16, 18, 20 has a length, L1, and a width, W1, in a direction transverse to the length, L1.

Figure 2:
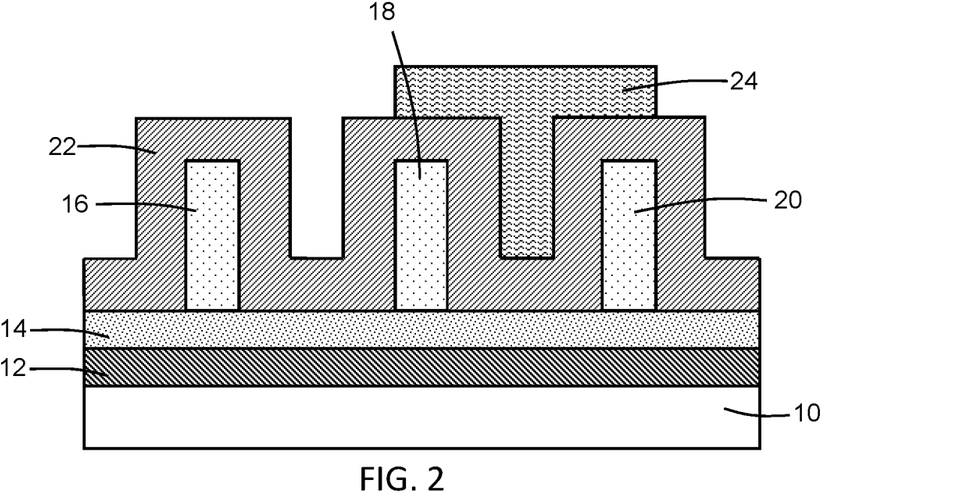

With reference to FIG. 2 in which like reference numerals refer to like features in FIG. 1 and at a subsequent fabrication stage of the processing method, a conformal spacer layer 22 composed of a dielectric material is subsequently deposited using, for example, atomic layer deposition. The material constituting the conformal spacer layer 22 may be chosen so as to be removed by a given etch chemistry selective to the material of the mandrels 16, 18, 20. For example, if the mandrels 16, 18, 20 are composed of amorphous silicon, the dielectric material constituting the conformal spacer layer 22 may be composed of a dielectric material such as titanium oxide ($TiO_x$) or silicon dioxide ($SiO_2$).

After the conformal spacer layer 22 is deposited, a pillar 24 is formed that covers a section of the conformal spacer layer 22 generally arranged between the mandrel 18 and the mandrel 20. The pillar 24 may be composed of a spin-on hardmask that is composed of an organic material, such as a polymer or an organic planarization material (OPL), or another material, and that is patterned by with lithography and etching processes. The pillar 24 provides a mechanism for forming a non-mandrel cut that ultimately appears as a tip-to-tip cut between subsequently-formed interconnects. The material constituting the conformal spacer layer 22 may also be chosen so as to be removed by a given etch chemistry selective to the material of the pillar 24.

Figure 3:
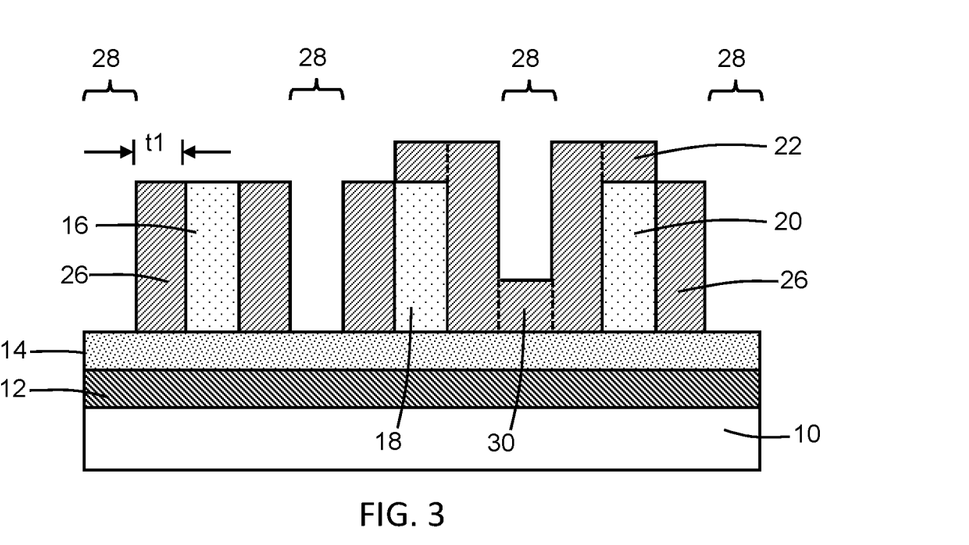

With reference to FIG. 3 in which like reference numerals refer to like features in FIG. 2 and at a subsequent fabrication stage of the processing method, sidewall spacers 26 are formed from the conformal spacer layer 22 at locations adjacent to the vertical sidewalls of the mandrels 16, 18, 20. The sidewall spacers 26 may be formed by shaping the conformal spacer layer 22 with an anisotropic etching process, such as reactive ion etching (RIE), that removes the material of the conformal spacer layer 22 selective to the materials of the hardmask 14, the mandrels 16, 18, 20, and the pillar 24. The sidewall spacers 26 have a thickness, t1, that may be nominally equal to the thickness of the conformal spacer layer 22.

Non-mandrel lines 28 are defined as linear spaces or gaps arranged between the sidewall spacers 26 on the mandrels 16, 18, 20. Portions of the hardmask 14 are revealed or exposed along the non-mandrel lines 28 by the removal of unmasked sections of the conformal spacer layer 22. A portion of the conformal spacer layer 22 covered and masked by the pillar 24 during the anisotropic etching process provides a non-mandrel cut mask 30 that is arranged along the length of one of the non-mandrel lines 28. The non-mandrel cut mask 30 is in direct contact with the hardmask 14. Following the anisotropic etching process, the pillar 24 may be removed by, for example, ashing with a plasma.

Figure 4:
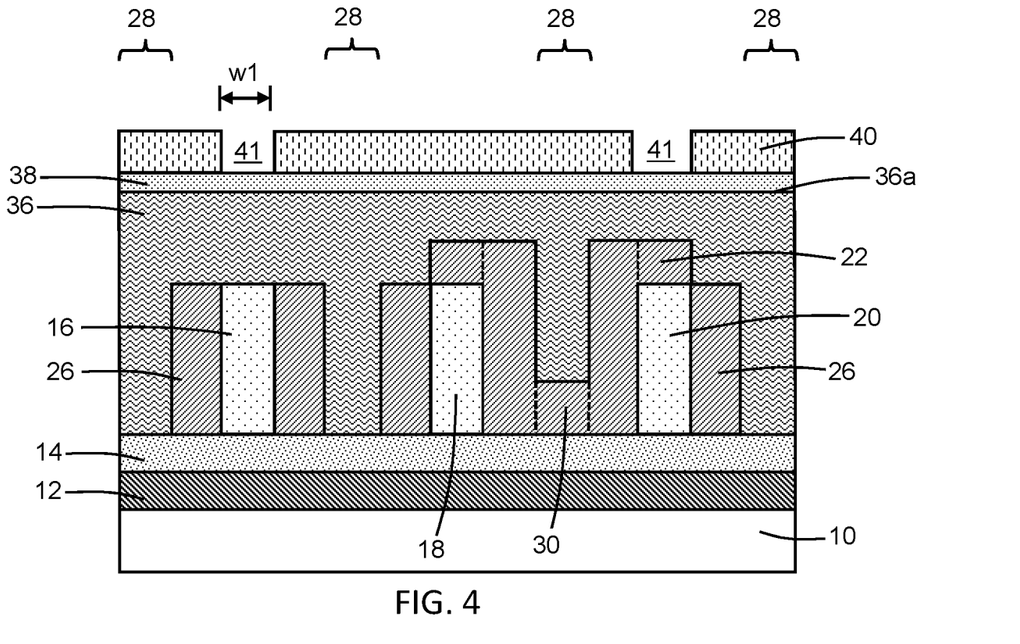
Figure 4A:
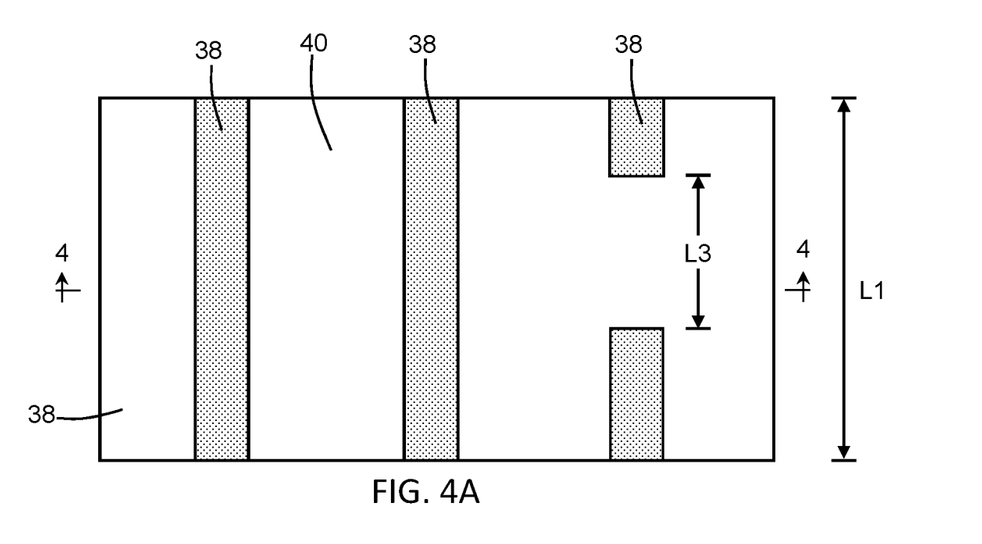

With reference to FIGS. 4, 4A in which like reference numerals refer to like features in FIG. 3 and at a subsequent fabrication stage of the processing method, a planarizing layer 36 and a hardmask layer 38 are formed over the mandrels 16, 18, 20, the sidewall spacers 26, the non-mandrel cut mask 30, and areas of the hardmask 14 exposed by the non-mandrel lines 28. The planarizing layer 36, which has a planar top surface 36a, may be a spin-on hardmask that is composed of an organic material. In an embodiment, the organic material contained in the planarizing layer 36 may be a polymer that is carbon-based. In an embodiment, the organic material contained in the planarizing layer 36 may be an organic planarization layer (OPL) material. The planarizing layer 36 provides gap fill of the gaps between the sidewall spacers 26 on the mandrels 16, 18, 20, and has a thickness that is sufficient to cover and bury the mandrels 16, 18, 20 and sidewall spacers 26. The planarizing layer 36 may be deposited in multiple stages including an initial stage in which a deposited layer is recessed. The hardmask layer 38 may be composed of a dielectric material, such as silicon-oxygen nitride (SiON).

An etch mask 40 is formed over the hardmask layer 38 and the planarizing layer 36 by a lithography process. The etch mask 40 may include a lithography stack containing a photoresist and a bottom anti-reflection coating in which the photoresist may be applied as a fluid by a spin coating process, pre-baked, exposed to light projected through a photomask, baked after exposure, and developed with a chemical developer, and in which the bottom anti-reflection coating may be applied before the photoresist is applied and patterned after the photoresist is developed. The etch mask 40 includes openings 41 that are arranged with a layout in an inversed pattern that matches the pattern of the mandrels 16, 18, 20. A portion of the etch mask 40 covers an area on a top surface of the hardmask layer 38 that is arranged over the entire width of a lengthwise section of the mandrel 18, which subsequently provides a mandrel cut in the interconnect layout.

Figure 5:
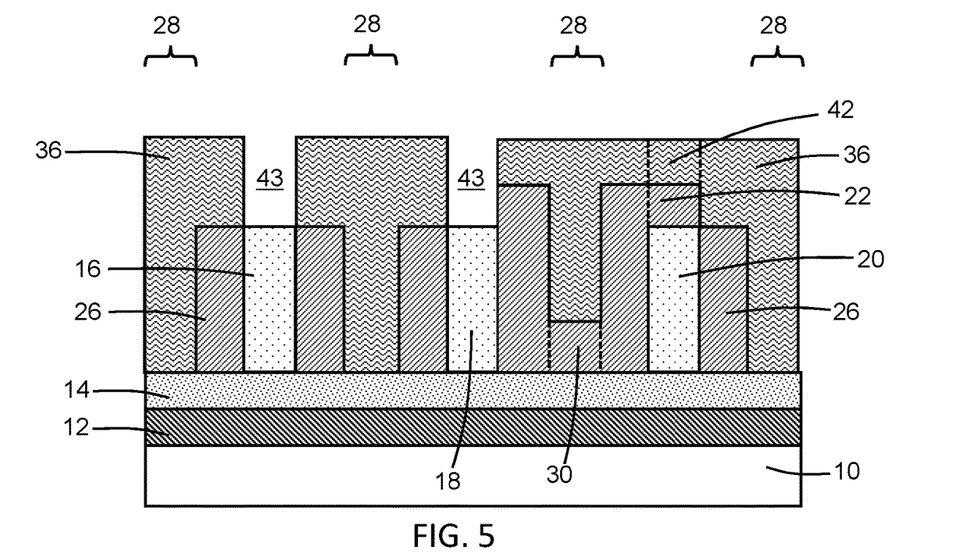
Figure 5A:
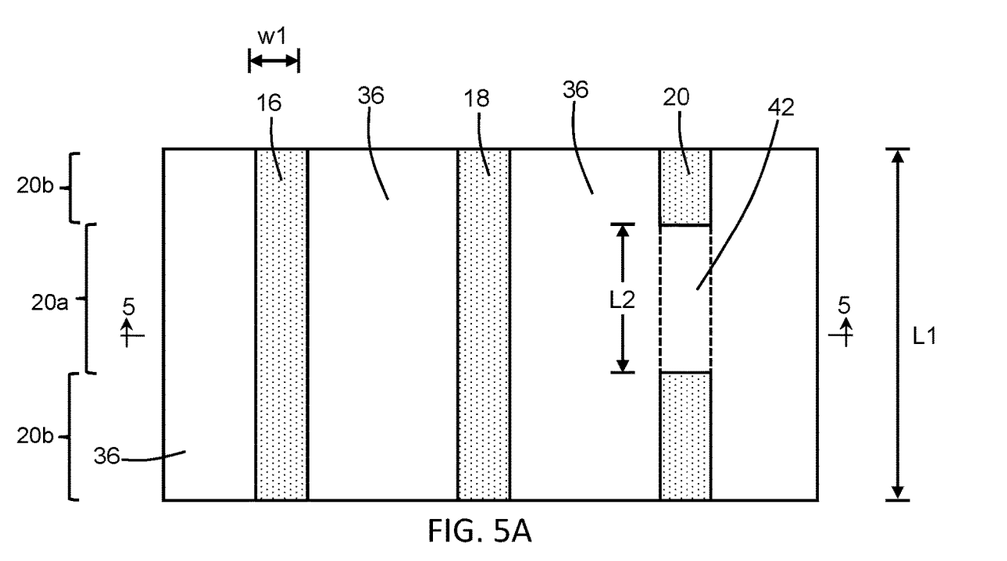

With reference to FIGS. 5, 5A in which like reference numerals refer to like features in FIG. 4 and at a subsequent fabrication stage of the processing method, the hardmask layer 38 and the planarizing layer 36 are patterned by an etching process that forms trenches 43 that penetrate through the planarizing layer 36 at the locations of the openings 41 in the etch mask 40. The trenches 43 expose the conformal spacer layer 22 over the mandrels 16, 18 and the conformal spacer layer 22 over unmasked lengthwise sections 20b of the mandrel 20. Residual sections of the conformal spacer layer 22 exposed by the trenches 43 are etched and removed. The etch mask 40 may be removed during the etching process transferring the pattern of trenches 43 to the planarizing layer 36. The hardmask layer 38 may be removed after transferring the pattern of trenches 43 to the planarizing layer 36. The trenches 43 and openings 41 are aligned in that their respective inner boundaries are continuous or substantially continuous.

The trenches 43 in the planarizing layer 36 expose (i.e., reveal) the mandrel 16, the mandrel 18, and the unmasked lengthwise sections 20b of the mandrel 20 for subsequent removal. The trenches 43 have a width that is equal to or substantially equal to the width, W1, of the mandrels 16, 18, 20. The planarizing layer 36 also includes a section, generally indicated by reference numeral 42, that covers a lengthwise section 20a of the mandrel 20. Only a fraction of the length, L1, of the mandrel 20 is overlapped in a lengthwise direction by the length, L2, of the section 42 of the planarizing layer 36. The masked lengthwise section 20a of the mandrel 20 is arranged along the length of the mandrel 20 between the adjacent unmasked lengthwise sections 20b of the mandrel 20. The masked lengthwise section 20a of the mandrel 20 provides a mechanism for forming a mandrel cut that ultimately appears as a tip-to-tip cut between subsequently-formed interconnects. The planarizing layer 36 also covers the sidewall spacers 26 and the non-mandrel cut mask 30 during the etching process forming the trenches 43.

Figure 6:
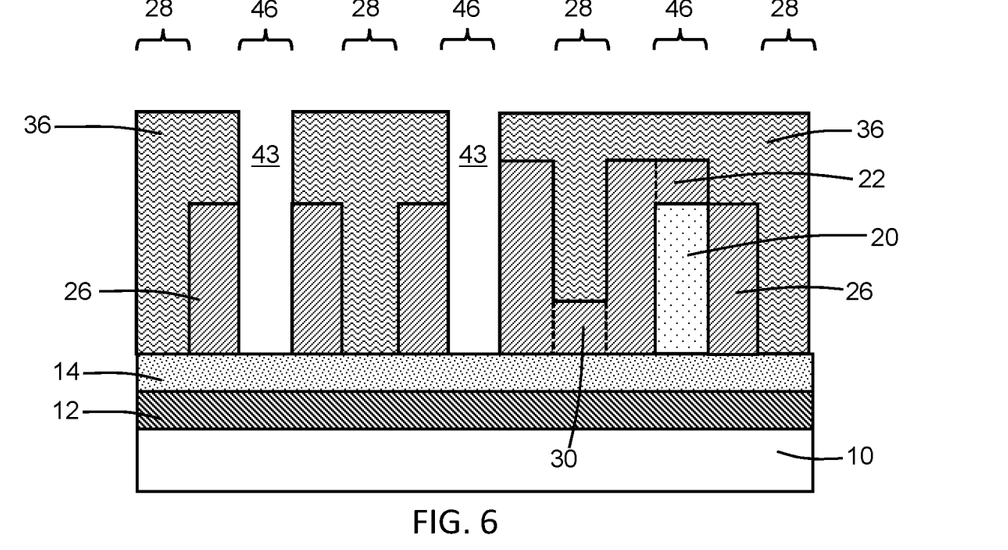

With reference to FIG. 6 in which like reference numerals refer to like features in FIG. 5 and at a subsequent fabrication stage of the processing method, the mandrel 16, the mandrel 18, and the unmasked lengthwise sections 20b (FIG. 5A) of the mandrel 20 are pulled and removed selective to the planarizing layer 36 with an etching process having a suitable etch chemistry. The patterned planarizing layer 36 masks the sidewall spacers 26, the non-mandrel cut mask 30, and the lengthwise section 20a of the mandrel 20 during the etching process. The trenches 43 in the planarizing layer 36 provide access for the etching process. Mandrel removal generates mandrel lines 46 that are arranged between the sidewall spacers 26 as linear spaces and over which strips of the hardmask 14 are revealed. The non-mandrel lines 28 and the mandrel lines 46 may have a parallel arrangement and alternate in a direction transverse to their respective lengths.

The section 42 of the planarizing layer 36 masks and covers the lengthwise section 20a (FIG. 5A) of the mandrel 20, which is preserved and not pulled, arranged along the length of one of the mandrel lines 46. The unetched lengthwise section 20a of the mandrel 20 interrupts and cuts the continuity of one of the mandrel lines 46, and divides this mandrel line 46 into discrete sections separated by the lengthwise section 20a of the mandrel 20. The unetched lengthwise section 20a of the mandrel 20 covers a portion 21 of the hardmask 14. The removal of the lengthwise sections 20b of the mandrel 20 exposes respective portions 23 of the hardmask 14 that are arranged along the length of the associated mandrel line 46. The portion 21 of the hardmask 14 is arranged along the length of the associated mandrel line 46 between the portions 23 of the hardmask 14. Unbroken portions 25 of the hardmask 14 are exposed along the mandrel lines 46 after removing the mandrels 16, 18.

Figure 7:
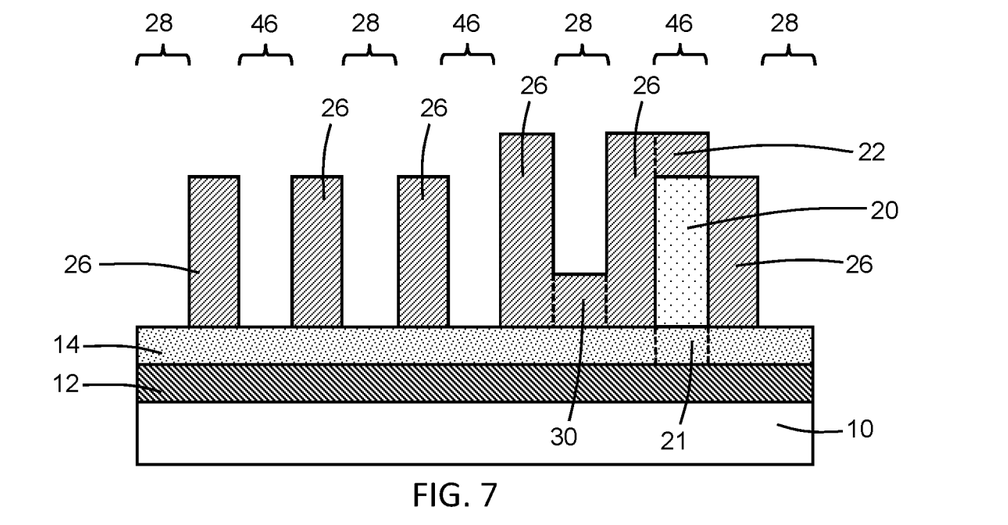
Figure 7A:
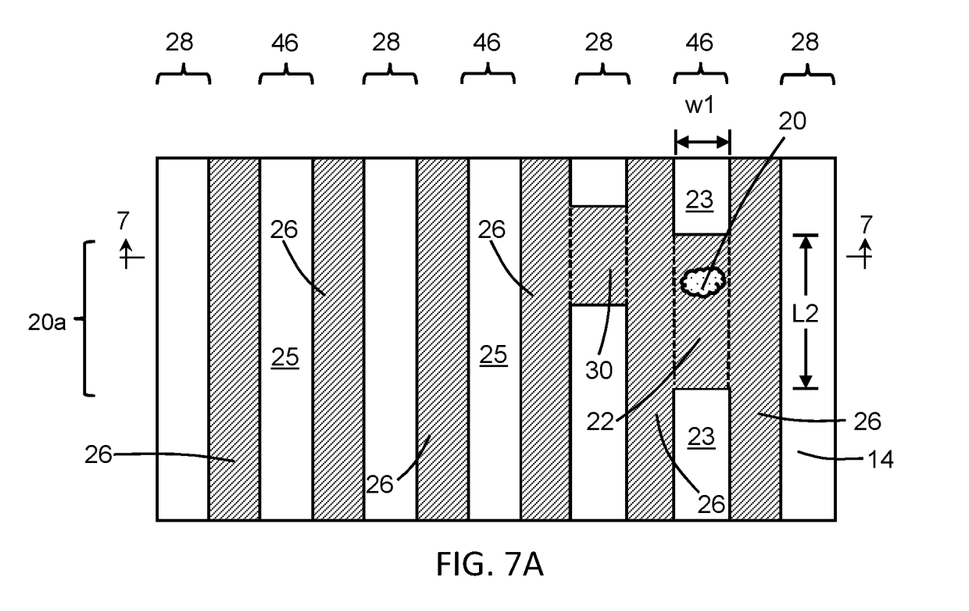

With reference to FIGS. 7, 7A in which like reference numerals refer to like features in FIG. 6 and at a subsequent fabrication stage of the processing method, the planarizing layer 36 is removed by, for example, ashing using an oxygen plasma and/or an etching process. The unetched lengthwise section 20a of the mandrel 20 defines the location of a mandrel cut between a pair of linearly-aligned metal interconnects subsequently formed in the interlayer dielectric layer 10 using the sections of the associated mandrel line 46 formerly covered by the removed lengthwise sections 20b (FIG. 5A) of the mandrel 20. The length of the unetched lengthwise section 20a of the mandrel 20 in a direction parallel to the length of the sections of the associated mandrel line 46 is equal to the length, L2, of the section 42 of the planarizing layer 36, and subsequently determines a tip-to-tip spacing or distance between the tips or ends of the metal interconnects terminating at the unetched lengthwise section 20a of the mandrel 20 and facing each other across the length of the unetched section of the mandrel 20.

The tip-to-tip spacing between the ends of the sections of the cut mandrel line 46, which is defined independent of the formation of the sidewall spacers 26, may be greater than a distance equal to twice the thickness of the sidewall spacers 26. The tip-to-tip spacing between the ends of the sections of the cut mandrel line 46 may be varied by selecting the length, L2, of the section 42 of the planarizing layer 36, and provides for variable-space mandrel cuts that can be produced independent of spacer thickness. The formation of the trenches 43 and subsequent mandrel pull decouples the formation of the mandrel cut in the mandrel line 46 from the wrapping of the sidewall spacers 26 about the tips of the divided sections of the mandrel 18. As a result, kinking may be eliminated and the probability is reduced that interconnects in the BEOL interconnect structure formed using the non-mandrel lines 28 will be shorted as a consequence of kinking.

Figure 8:
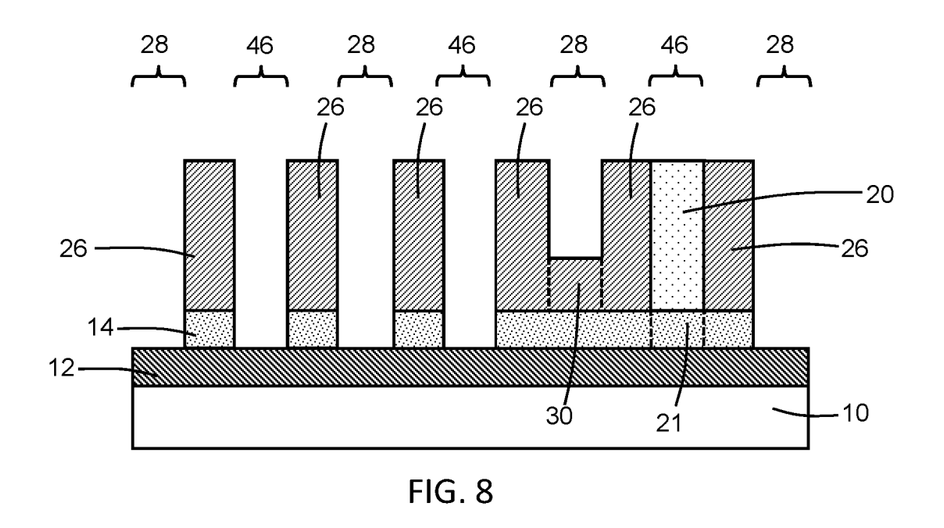

With reference to FIG. 8 in which like reference numerals refer to like features in FIG. 7 and at a subsequent fabrication stage of the processing method, the pattern including the non-mandrel lines 28 and mandrel lines 46 is transferred to the hardmask 14 by an etching process that removes unmasked portions of the hardmask 14. The non-mandrel lines 28 and mandrel lines 46 are arranged between the sidewall spacers 26, which cover areas of the hardmask 14 during the etching process. The unetched lengthwise section 20a (FIG. 5A) of the mandrel 20 masks a portion of the hardmask 14 along a lengthwise section of one of the mandrel lines 46 and the non-mandrel cut mask 30 masks a portion of the hardmask 14 along another lengthwise section of one of the non-mandrel lines 28. The non-mandrel lines 28 and mandrel lines 46 extend through the full thickness of the hardmask 14, and the material of the hardmask 12 may function as an etch stop for the etching process. The conformal spacer layer 22 over the lengthwise section 20a of mandrel 20 may be removed during the patterning of the hardmask 14 or by performing a separate etching process.

Figure 9:
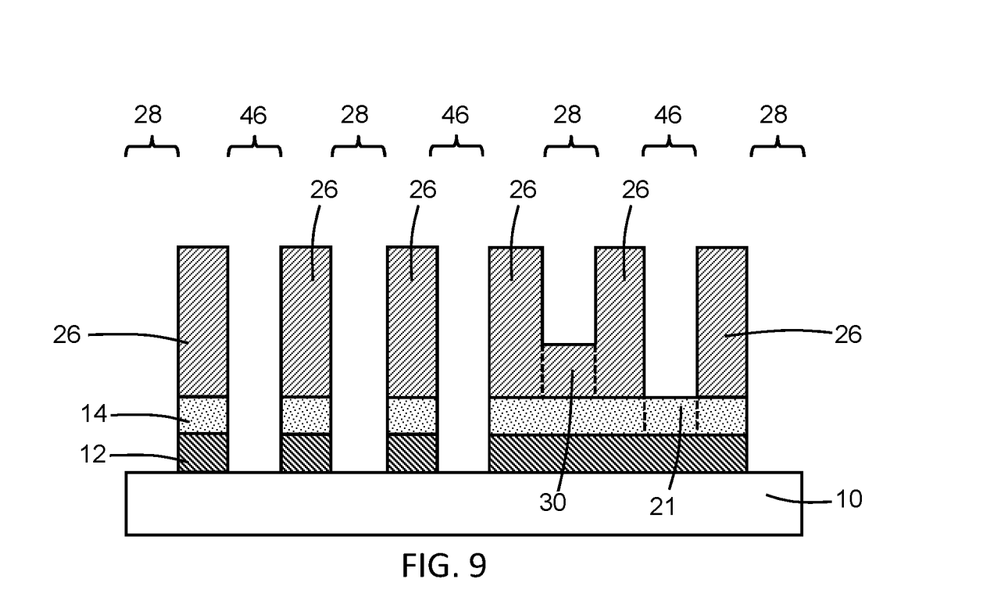

With reference to FIG. 9 in which like reference numerals refer to like features in FIG. 8 and at a subsequent fabrication stage of the processing method, the unetched lengthwise section 20a (FIG. 5A) of the mandrel 20 is removed with an etching process selective to the sidewall spacers 26 and the exposed material of the hardmask 12. The hardmask 12 is then patterned by an etching process to transfer the pattern including the non-mandrel lines 28, mandrel lines 46, and cuts embodied by the non-mandrel cut mask 30 and the portion of the hardmask 12 formerly covered by the lengthwise section 20a of mandrel 20 from the hardmask 14 to the hardmask 12. The patterned hardmask 14 operates as an etch mask during pattern transfer to the hardmask 12. The etching process may stop on the dielectric material of the interlayer dielectric layer 10, and the non-mandrel lines 28 and mandrel lines 46 extend through the full thickness of the hardmask 12 other than at the locations of the respective cuts.

Figure 10:
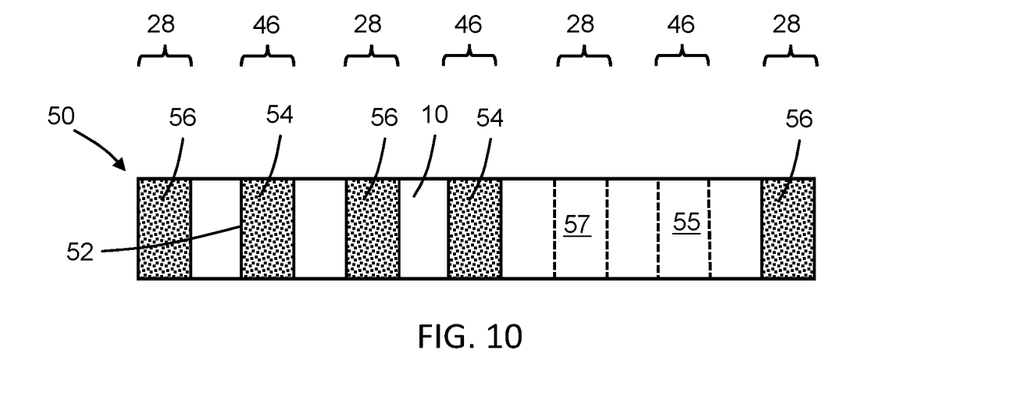
Figure 10A:
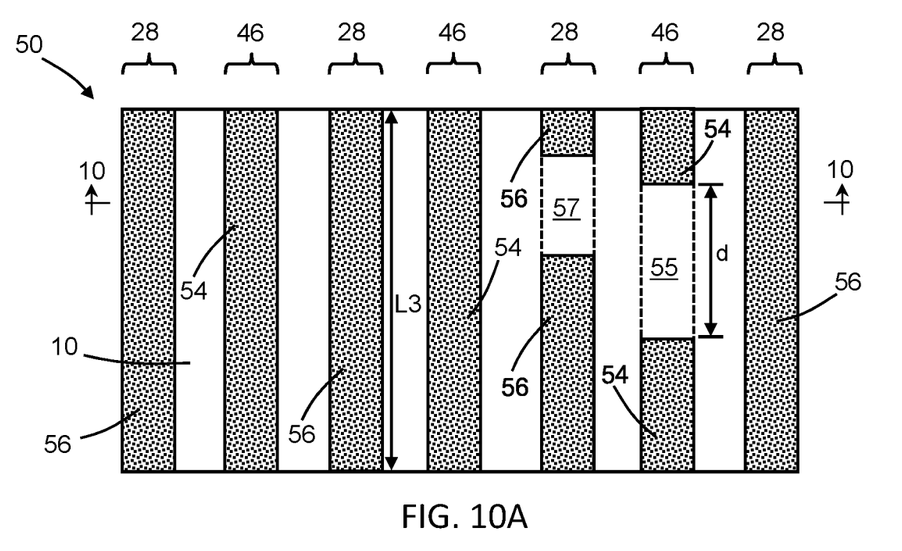

With reference to FIGS. 10, 10A in which like reference numerals refer to like features in FIG. 9 and at a subsequent fabrication stage of the processing method, the interlayer dielectric layer 10 is then patterned by an etching process with the patterned hardmask 12, and optionally the patterned hardmask 14, operating as an etch mask to transfer the pattern of non-mandrel lines 28 and mandrel lines 46 with cuts from the hardmask 12 to the interlayer dielectric layer 10 as a pattern of trenches 52. A back-end-of-line interconnect structure 50 is formed by filling the trenches 52 in the interlayer dielectric layer 10 with one or more conductors to form interconnects 54, 56 as features in the form of wires that are embedded in the interlayer dielectric layer 10. The interconnects 54 are formed in the interlayer dielectric layer 10 along the mandrel lines 46 in the transferred pattern, and the interconnects 56 are formed in the interlayer dielectric layer 10 along the non-mandrel lines 28 in the transferred pattern.

The primary conductor of the interconnects 54, 56 may be composed of a low-resistivity metal formed using a deposition process, such as copper (Cu) or cobalt (Co) deposited by, for example, electroplating or electroless deposition or chemical vapor deposition. A liner (not shown) composed of titanium (Ti), titanium nitride (TiN), tantalum (Ta), tantalum nitride (TaN), or a layered combination of these materials (e.g., a bilayer of TaN/Ta) may be applied to the trenches 52 before filling with a primary electrical conductor. In an embodiment, the interconnects 54, 56 may be conductive features located in a metallization level that is the closest of multiple metallization levels of the back-end-of-line interconnect structure 50 to the device structures and substrate, and in which the interconnects 54, 56 may be connected with the device structures by contacts in an intervening contact level.

The interlayer dielectric layer 10 includes a non-mandrel cut 57, which is arranged between a pair of the interconnects 56, that represents a preserved section of dielectric material of the interlayer dielectric layer 10 masked by a section of the hardmask 12 that was formerly covered by the non-mandrel cut mask 30. The interlayer dielectric layer 10 also includes a mandrel cut 55, which is arranged between a pair of the interconnects 54, that represents a preserved section of dielectric material of the interlayer dielectric layer 10 masked by a section of the hardmask 12 during the etching process that was formerly covered by the section 42 of the planarizing layer 36. The interconnects 54 have a tip-to-tip spacing, d, between their respective ends given by a dimension of the mandrel cut 55 parallel to the length, L3, of the interconnects 54.

The tip-to-tip spacing, d, for the mandrel cut 55 in the interconnect 54 is not limited to a distance equal to twice the thickness of the sidewall spacers 26. As a result, the tip-to-tip spacing of the interconnects 54 can exceed the spacer-related distance without any susceptibility to shorting. The tip-to-tip spacing for the mandrel cut 55 is a variable space that can be selected as part of the device design. In addition, because the sidewall spacers 26 do not have to wrap about the tips of the sections of the cut mandrel 20, indents are absent that could otherwise produce kinks at the side edges of the interconnects adjacent into the mandrel cut 55.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    depositing a hardmask over an interlayer dielectric layer;
    forming a first mandrel over the hardmask;
    forming a first sidewall spacer and a second sidewall spacer over the hardmask, wherein the first mandrel is arranged between the first sidewall spacer and the second sidewall spacer;
    forming a planarizing layer over the first mandrel, the first sidewall spacer, the second sidewall spacer, and the hardmask;
    patterning the planarizing layer to form a first trench exposing a first lengthwise section of the first mandrel, a second trench exposing a second lengthwise section of the first mandrel, and a first portion of the planarizing layer covering a third lengthwise section of the first mandrel arranged between the first lengthwise section of the first mandrel and the second lengthwise section of the first mandrel; and
    removing the first lengthwise section and the second lengthwise section of the first mandrel with a first etching process to define a pattern including a mandrel line exposing respective first portions of the hardmask, wherein the third lengthwise section of the first mandrel is masked by the first portion of the planarizing layer during the first etching process, and the third lengthwise section of the first mandrel covers a second portion of the hardmask arranged along the mandrel line between the first portions of the hardmask.

2. The method of claim 1 wherein the first sidewall spacer and the second sidewall spacer have a thickness, and the first lengthwise section of the first mandrel and the second lengthwise section of the first mandrel are separated by a tip-to-tip spacing that is greater than twice the thickness.

3. The method of claim 1 wherein the planarizing layer masks the first sidewall spacer and the second sidewall spacer during the first etching process.

4. The method of claim 1 wherein the first trench and the second trench are arranged between the first sidewall spacer and the second sidewall spacer.

5. The method of claim 1 wherein patterning the planarizing layer comprises:
   forming a lithography stack including a photoresist layer over the planarizing layer; and
   patterning the lithography stack to form an etch mask including a first opening arranged over the first lengthwise section of the first mandrel and a second opening arranged over the second lengthwise section of the first mandrel,
   wherein the first opening is registered in position with the first trench, and the second opening is registered in position with the second trench.

6. The method of claim 5 wherein the etch mask is removed when the planarizing layer is patterned.

7. The method of claim 5 wherein a hardmask layer is arranged between the etch mask and the planarizing layer, and the hardmask layer is patterned to include the first trench and the second trench before patterning the planarizing layer.

8. The method of claim 1 wherein the planarizing layer has a planar top surface, and the planarizing layer is applied by a spin-on process.

9. The method of claim 1 further comprising:
   forming a non-mandrel cut mask that covers a third portion of the hardmask,
   wherein the planarizing layer masks the non-mandrel cut mask during the first etching process.

10. The method of claim 1 wherein the first trench and the second trench in the planarizing layer have a first width, and the first mandrel has a second width that is substantially equal to the first width.

11. A method comprising:
   depositing a hardmask over an interlayer dielectric layer;
   forming a first mandrel over the hardmask;
   forming a planarizing layer over the first mandrel and the hardmask;
   patterning the planarizing layer to form a first trench exposing a first lengthwise section of the first mandrel, a second trench exposing a second lengthwise section of the first mandrel, and a first portion of the planarizing layer covering a third lengthwise section of the first mandrel arranged between the first lengthwise section of the first mandrel and the second lengthwise section of the first mandrel;
   removing the first lengthwise section and the second lengthwise section of the first mandrel with a first etching process to define a pattern including a mandrel line exposing respective first portions of the hardmask; and
   transferring the pattern to the hardmask with a second etching process,
   wherein the third lengthwise section of the first mandrel is masked by the first portion of the planarizing layer during the first etching process, the third lengthwise section of the first mandrel covers a second portion of the hardmask arranged along the mandrel line between the first portions of the hardmask, and the third lengthwise section of the first mandrel masks the second portion of the hardmask during the second etching process.

12. The method of claim 11 further comprising:
   after the second etching process, removing the third lengthwise section of the first mandrel.

13. The method of claim 11 further comprising:
   transferring the pattern from the hardmask to the interlayer dielectric layer; and
   forming a plurality of interconnects in the interlayer dielectric layer that are arranged with the pattern.

14. The method of claim 11 wherein transferring the pattern to the hardmask with the second etching process comprises:
   removing the first portions of the hardmask with the third lengthwise section of the first mandrel over the second portion of the hardmask during the second etching process.

15. The method of claim 11 wherein the second portion of the hardmask is masked by the third lengthwise section of the first mandrel during the first etching process, and the first portions of the hardmask are separated by the second portion of the hardmask following the first etching process.

16. The method of claim 11 further comprising:
   forming a non-mandrel cut mask that covers a third portion of the hardmask,
   wherein the planarizing layer masks the non-mandrel cut mask during the first etching process.

17. A method of comprising:
   depositing a hardmask over an interlayer dielectric layer;
   forming a first mandrel over the hardmask;
   forming a second mandrel over the hardmask adjacent to the first mandrel;
   forming a first sidewall spacer adjacent to the first mandrel and a second sidewall spacer adjacent to the second mandrel;
   forming a planarizing layer over the first mandrel, the second mandrel, the first sidewall spacer, the second sidewall spacer, and the hardmask;
   patterning the planarizing layer to form a first trench exposing a first lengthwise section of the first mandrel, a second trench exposing a second lengthwise section of the first mandrel, and a first portion of the planarizing layer covering a third lengthwise section of the first mandrel arranged between the first lengthwise section of the first mandrel and the second lengthwise section of the first mandrel;
   removing the first lengthwise section and the second lengthwise section of the first mandrel with a first etching process to define a pattern including a mandrel line exposing respective first portions of the hardmask; and
   wherein the third lengthwise section of the first mandrel is masked by the first portion of the planarizing layer during the first etching process, the third lengthwise section of the first mandrel covers a second portion of the hardmask arranged along the mandrel line between the first portions of the hardmask, the pattern includes a non-mandrel line arranged between the first sidewall spacer and the second sidewall spacer, and the planarizing layer masks the hardmask along the non-mandrel line during the first etching process.

18. The method of claim 17 further comprising:
   forming a non-mandrel cut mask that covers a portion of the non-mandrel line, wherein the planarizing layer masks the non-mandrel cut mask during the first etching process.

19. The method of claim 18 wherein the first sidewall spacer, the second sidewall spacer, and the non-mandrel cut mask are concurrently formed by patterning a conformal spacer layer deposited before forming the planarizing layer.

20. The method of claim 18 wherein the first lengthwise section and the second lengthwise section of the first mandrel are removed with the first etching process after forming the non-mandrel cut mask.

* * * * *